(12) United States Patent
Shiah et al.

(10) Patent No.: US 7,054,178 B1
(45) Date of Patent: May 30, 2006

(54) DATAPATH ARCHITECTURE FOR HIGH AREA EFFICIENCY

(75) Inventors: Chun Shiah, Taichung (TW); Ming-Hung Wang, Hsin-Chu (TW); Chun-Chi Shen, Chutung (TW)

(73) Assignee: Etron Technology, Inc., Hsin-Chu (TW)

( * ) Notice: Subject to any disclaimer, the term of this patent is extended or adjusted under 35 U.S.C. 154(b) by 275 days.

(21) Appl. No.: 10/236,384

(22) Filed: Sep. 6, 2002

(51) Int. Cl.
*G11C 5/02* (2006.01)
*G11C 5/06* (2006.01)

(52) U.S. Cl. .......................... 365/51; 365/63
(58) Field of Classification Search ............. 365/51, 365/63, 205, 207, 208, 203, 230.03, 230.06
See application file for complete search history.

(56) References Cited

U.S. PATENT DOCUMENTS

| | | | | |
|---|---|---|---|---|
| 5,546,349 A | * | 8/1996 | Watanabe et al. ............. | 365/63 |
| 5,636,158 A | * | 6/1997 | Kato et al. ..................... | 365/51 |
| 5,754,479 A | * | 5/1998 | Ting et al. ..................... | 365/63 |
| 5,774,408 A | | 6/1998 | Shirley ................... | 365/230.03 |
| 5,856,947 A | * | 1/1999 | Fang ..................... | 365/230.03 |
| 5,923,605 A | * | 7/1999 | Mueller et al. ......... | 365/230.03 |
| 5,966,338 A | | 10/1999 | Liu et al. ..................... | 365/207 |
| 6,049,492 A | * | 4/2000 | Vogelsang et al. .......... | 365/203 |
| 6,091,667 A | * | 7/2000 | Tanaka et al. ......... | 365/230.03 |
| 6,249,451 B1 | * | 6/2001 | Okamura ..................... | 365/63 |
| 6,363,023 B1 | * | 3/2002 | Andersen et al. ............ | 365/207 |

\* cited by examiner

*Primary Examiner*—Trong Phan
(74) *Attorney, Agent, or Firm*—George D. Saile; Stephen B. Ackerman; Douglas B. Schnabe

(57) ABSTRACT

A particular DRAM data path architecture is disclosed. In accordance with this invention, the sharing of MDQ sense amplifiers simplifies the circuit design of the memory sub array. Fewer MDQ sense amplifiers and fewer unique MDQ lines leads to a reduced chip layout area. The high address bit of the word line row address (RA) is used to select a particular main data sense amp by means of a control switch. Not only are the sense amplifiers multiplexed for the new sub array, but the data I/O are multiplexed as well, leading to a significant reduction in the number of circuits required.

26 Claims, 7 Drawing Sheets

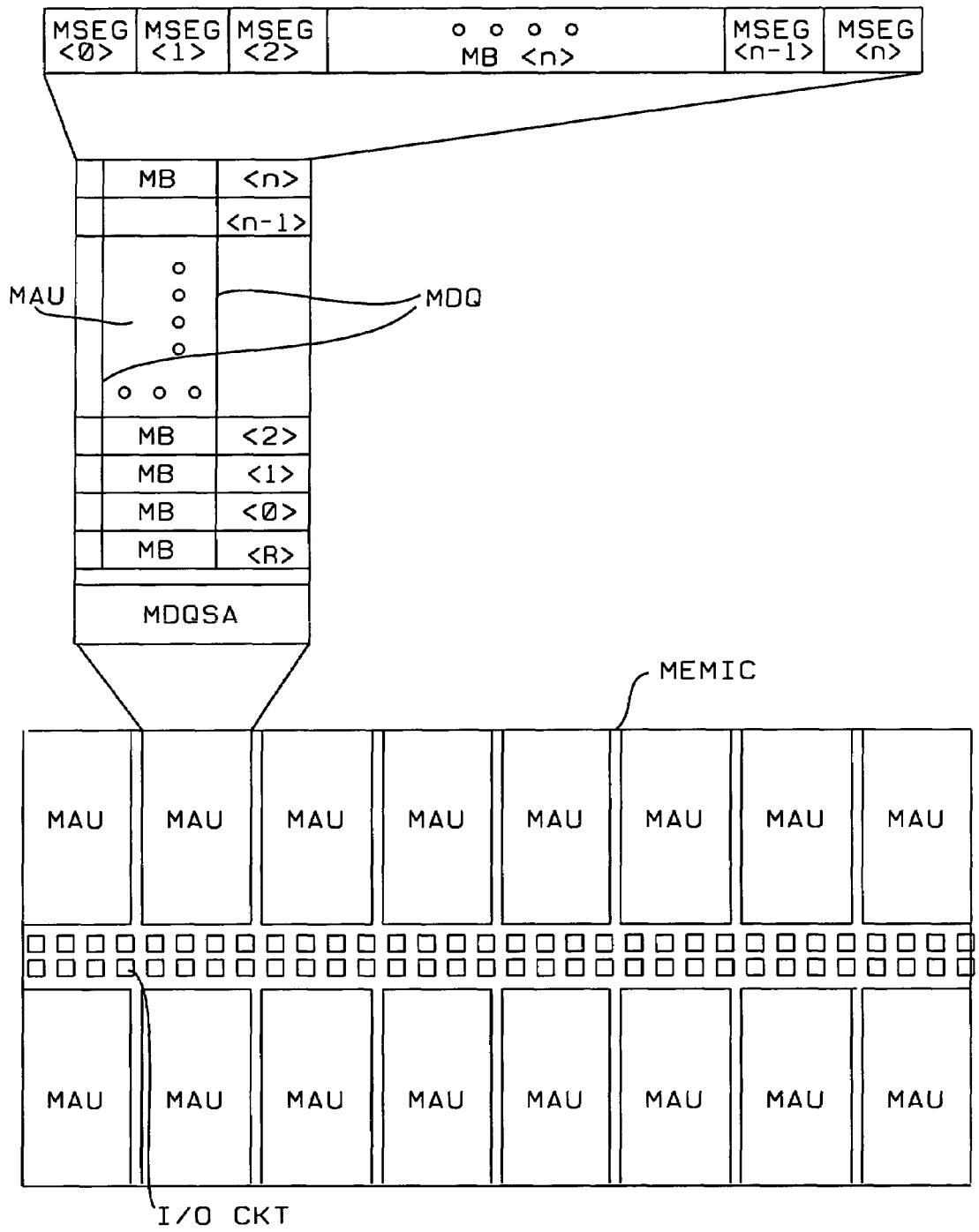
FIG. 1a – Prior Art

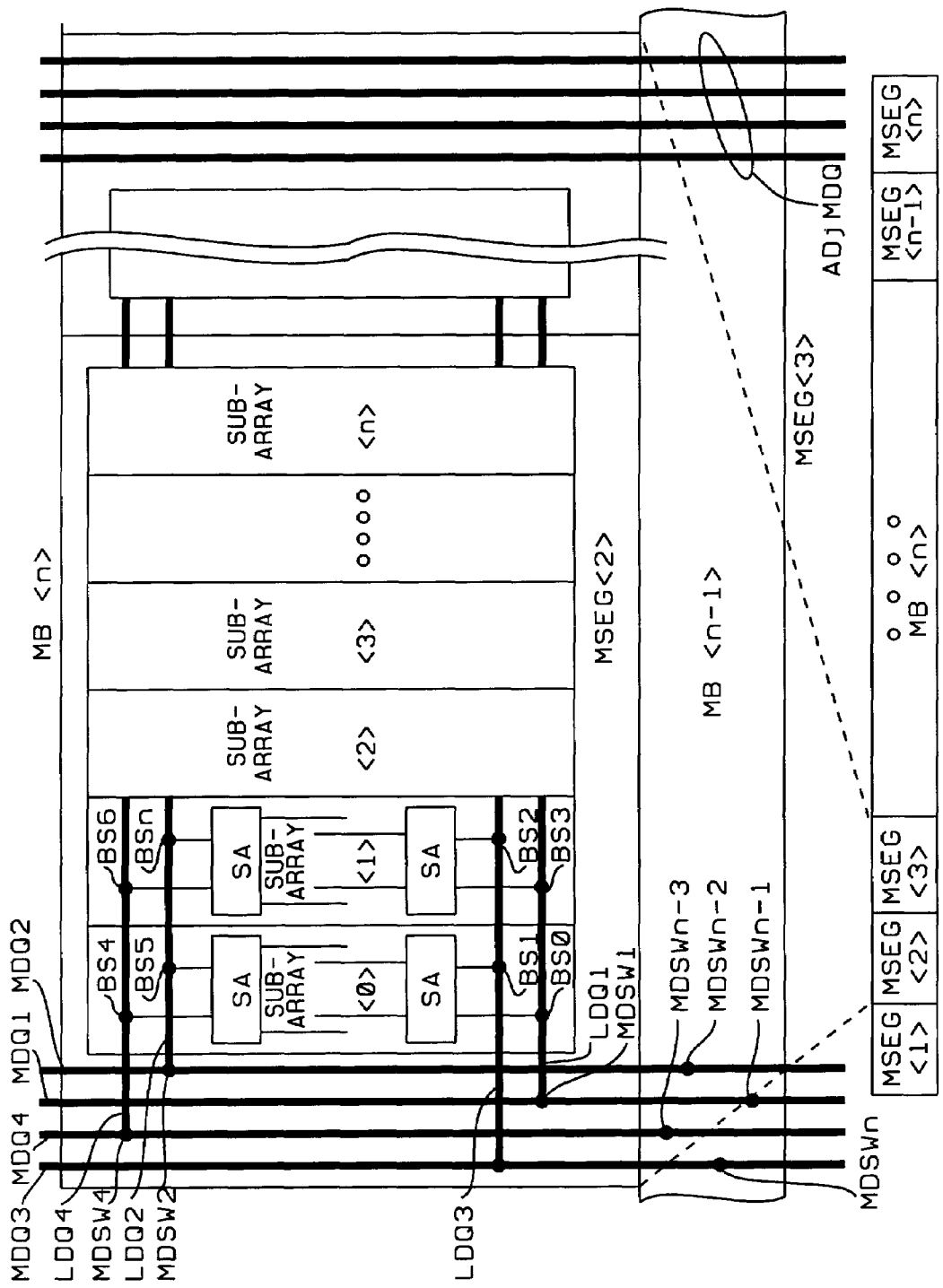
FIG. 1b – Prior Art

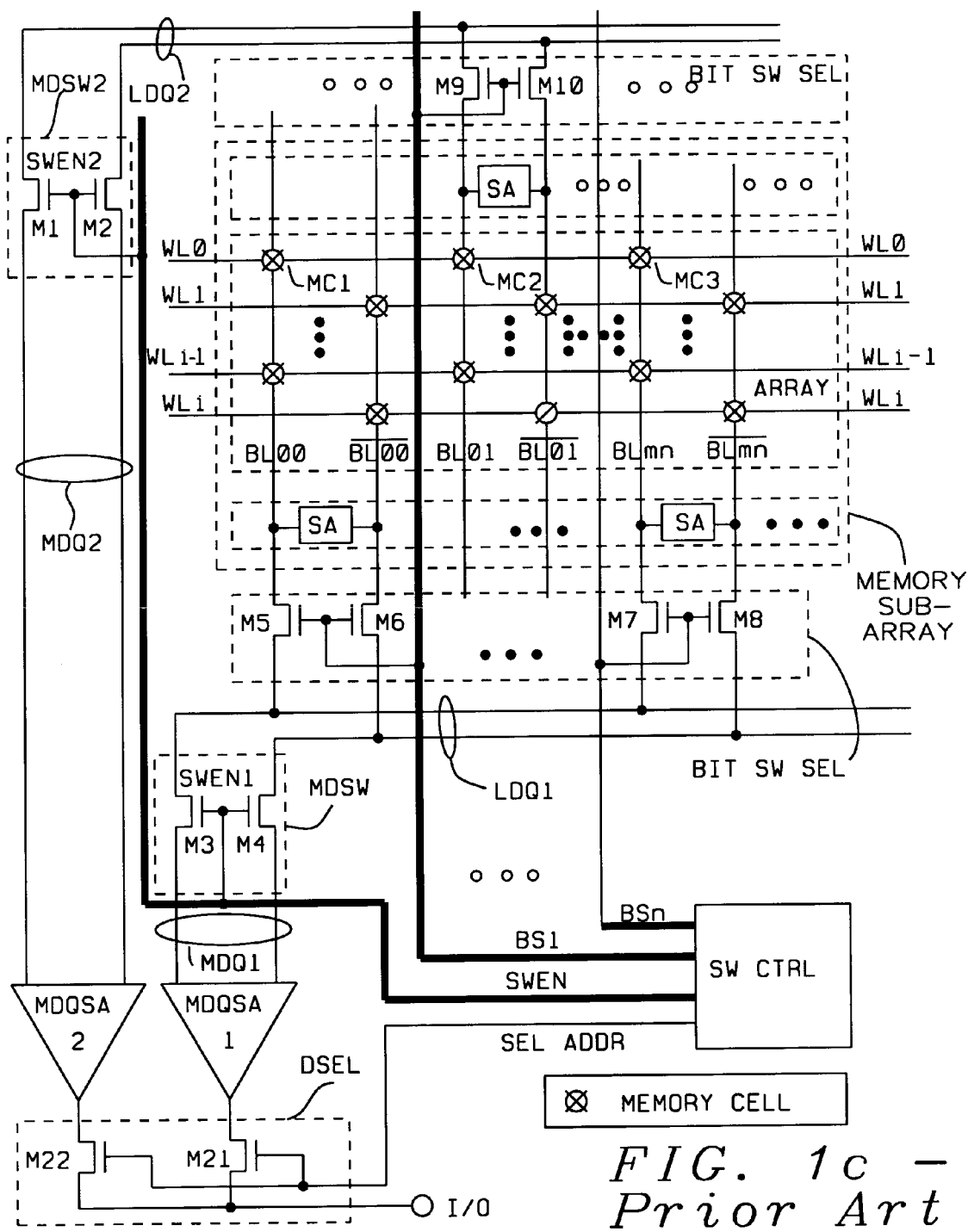
FIG. 1c – Prior Art

DATAPATH ARCHITECTURE FOR HIGH AREA EFFICIENCY

BACKGROUND OF THE INVENTION

1. Field of the Invention

The present invention generally relates to a DRAM (Dynamic Random Access Memory), and more particularly to a data path architecture for a DRAM.

2. Description of the Prior Art

Major design efforts have been directed at minimizing the chip area required for memory array cells. A number of solutions have been proposed, including methods to reduce overall chip area by reducing the number of circuits required in the layout. The following inventions illustrate integrated circuit memories that increase memory capacity while meeting minimum spacing requirements.

U.S. Pat. No. 5,774,408 to Shirley teaches a DRAM architecture where sense amplifiers are shared between memory cells. The invention reduces layout area by arranging sense amplifiers to minimize die area. The sense amplifiers are laid out in a region between memory array portions having memory cells that are each coupled to a digit line in a plurality of alternating sequenced digit line pairs.

U.S. Pat. No. 5,966,338 to Liu et al shows a DRAM with a staggered, bit line sense amplifier configuration with shared sense amplifiers. External sense amplifiers have output terminals, which are shorted together in pairs. The invention utilizes an input/output (I/O) data path scheme, which reduces the time delay through the array and simplifies the I/O data path as compared to the prior art.

Random access memories (RAM) such as a dynamic random access memory (DRAM), static random access memory (SRAM), and read only memory (ROM) are generally structured as shown in FIGS. 1a–1c. A memory integrated circuit is shown in FIG. 1a as having multiple independent memory array units MAU Each memory array unit is formed of groups of memory blocks MB<0>, . . . ,MB<n>. The memory block MB<R> acts as a redundant or spare block that can be configured to replace non-functioning areas of the remaining memory block MB<n>. FIG. 1a shows the input/output circuits (I/O CKT) represented by the small squares which are in the middle of the memory integrated circuit (MEMIC).

The bank of main data line sense amplifiers MDQSA sense the memory data signal from the selected memory blocks MB<O>, . . . , MB<n>, amplify, and convert the memory data signal to a signal level acceptable by the 110 circuitry of the memory integrated circuit. The input to each main data line sense amplifier of the bank of data line sense amplifiers MDQSA is a pair of main data lines MDQ that are connected to each of the memory blocks MB<O>, . . . , MB<n>.

Each memory block MB<O>, . . . , MB<n> is divided into a group of memory segments MSEG<O>, . . . , MSEG<n>. As shown in FIG. 1b, each memory segment is constructed of multiple sub-arrays. The structure of each memory sub-array, as shown in FIG. 1c has an array of memory cells arranged in rows and columns. At the periphery of the array of memory cells is a bank of bit line sense amplifiers SA. The output of each of the bit line sense amplifiers is coupled to a pair of local data lines LDQ1, . . . , LDQ4 through the bit switches BS1, . . . , BSn. In turn, the local data lines LDQ1 . . . , LDQ4 are selectively coupled to the main data lines MDQ1, . . . ,MDQ4 and thus to the main data line sense amplifiers. FIG. 1b also shows the adjacent data lines (ADiMDQ), which are the data lines which can affect the operation of the MDQ1–3 data lines and their support circuitry.

The main data switches MDSW1, . . . , MDSWn provide the selective connecting of the local data lines LDQ1, . . . ,LDQ4 to the main data line sense amplifiers. As shown, each main data line MDQ1, . . . , MDQ4 is connected through a main data switch MDSW1, . . . , MDSWN to the local data lines LDQ1, . . . ,LDQ4 for each memory block MB<n>. When memory cells within a memory block MB<0>, . . . , MB<n> are selected, the appropriate bit switches BS0, . . . , BSn and the appropriate main data switches MDSW1, . . . ,MDSWn are activated to insure that the selected memory cells are coupled to the main data line sense amplifiers MDQSA.

To avoid corruption of the memory data signals from the selected data cells, the bit switches BS0, . . . , BSn and the main data switches MDSW1, . . . , MDSWn must be activated such that only one memory cell is coupled to a main data line sense amplifier MDQSA. The rows of memory cells within each sub-array are activated by the word line control signals WL0, WL1, . . . , WLi.

The rows of memory cells within each sub-array are activated by the word line control signals WLO, WLI, . . . , WLi.

FIG. 1c shows the following components. SWENn are switch enable signals which enable pairs of bit lines to be read. Mn are memory cells. MDQSAn are sense amplifiers. BSn are bit sense lines. SEL ADDR is a select address control line. LDQn are load data lines to enable the reading of selected bit lines. SW CTRL is a switch control macro. BIT SW SEL is a bit switch select macro. BLmn are bit lines from an m by n matrix of bit lines. MCn are memory cells. SA are sense amplifiers.

The importance of reducing cost per bit of memory has led to a continuing search for simpler, smaller-area memory cells that could be more densely packaged on a chip. Memory cells with reduced complexity, area, and power consumption can be designed if dynamic MOS circuit concepts are used. Dynamic cells store binary data on a capacitance. Since normal leakage currents remove stored charge quickly, dynamic memories require periodic refreshing of stored charge. Additional circuit design techniques can be utilized to further reduce required chip area, as shown by the following invention.

SUMMARY OF THE INVENTION

It is therefore an object of the present invention to provide a DRAM data path architecture that minimizes chip area by sharing main data (MDQ) sense amplifiers between adjacent cells, thereby simplifying the data path as compared to the prior art. This is achieved by a DRAM memory array having fewer MDQ sense amplifiers and fewer unique main data input/output (MDQ) lines. The DRAM data path scheme uses memory sub arrays to limit the length of the row address lines, and uses a row address decode to address these memory sub arrays.

BRIEF DESCRIPTION OF THE DRAWINGS

The foregoing and other objects, aspects, and advantages will be better understood from the following detailed description of a preferred embodiment of the invention, with reference to the drawings, in which:

FIG. 1a is a prior art diagram of a memory integrated circuit having multiple independent memory units.

FIG. 1b is a prior art diagram of memory with multiple sub-arrays.

FIG. 1c is a prior art diagram of the detail of memory sub-arrays.

DESCRIPTION OF THE PREFERRED EMBODIMENT

Figure 2A:
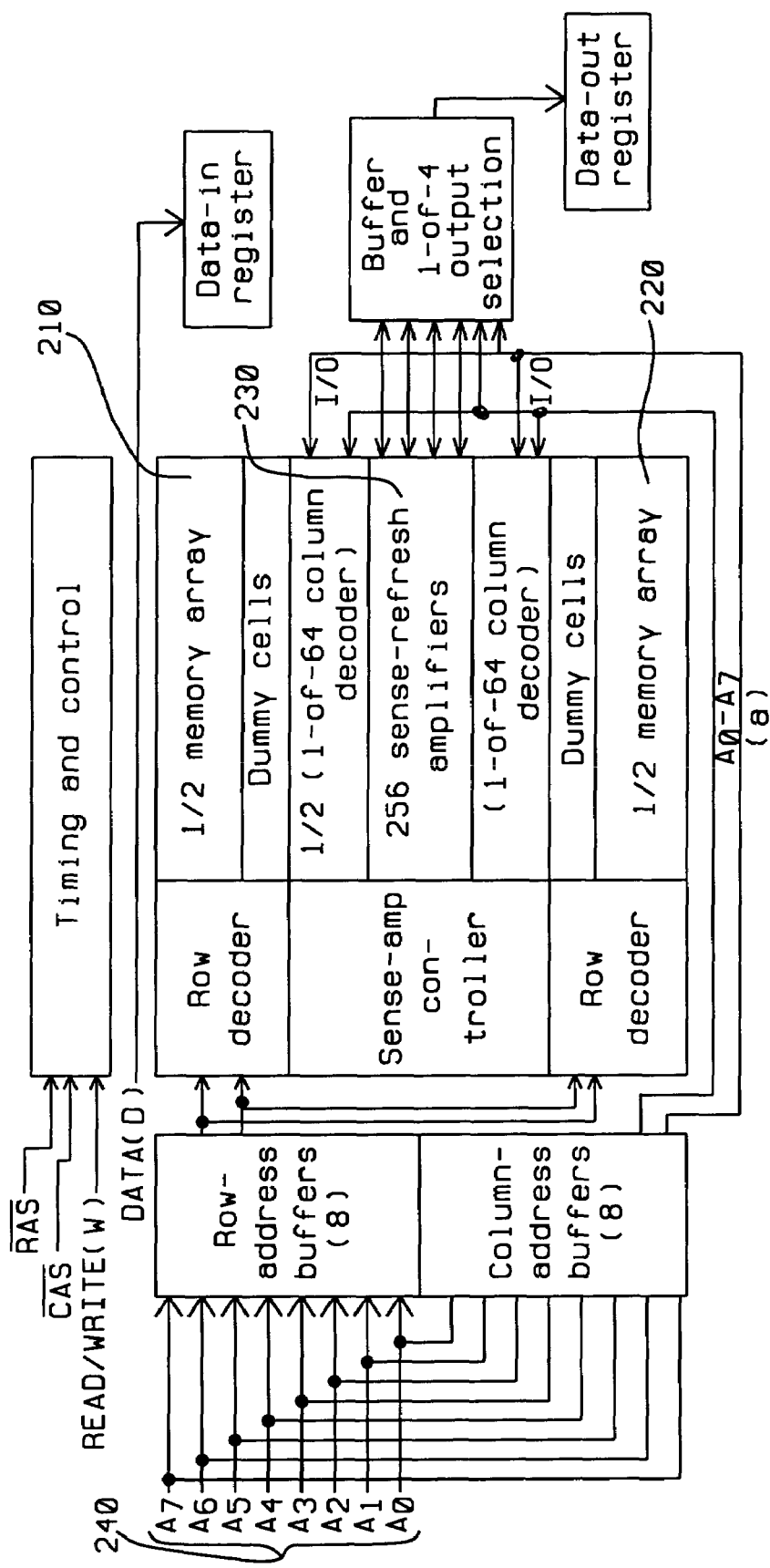
FIG. 2a is a block diagram of an asynchronous DRAM organization, to aid in understanding a typical memory organization.

The drawing in FIG. 2a represents a 64K dynamic RAM organized in two halves 210, 220 of 32K cells. In order to limit the row and column delays, the chip is organized into memory sub arrays, each sub array having its own sense amplifiers 230.

Figure 2B:
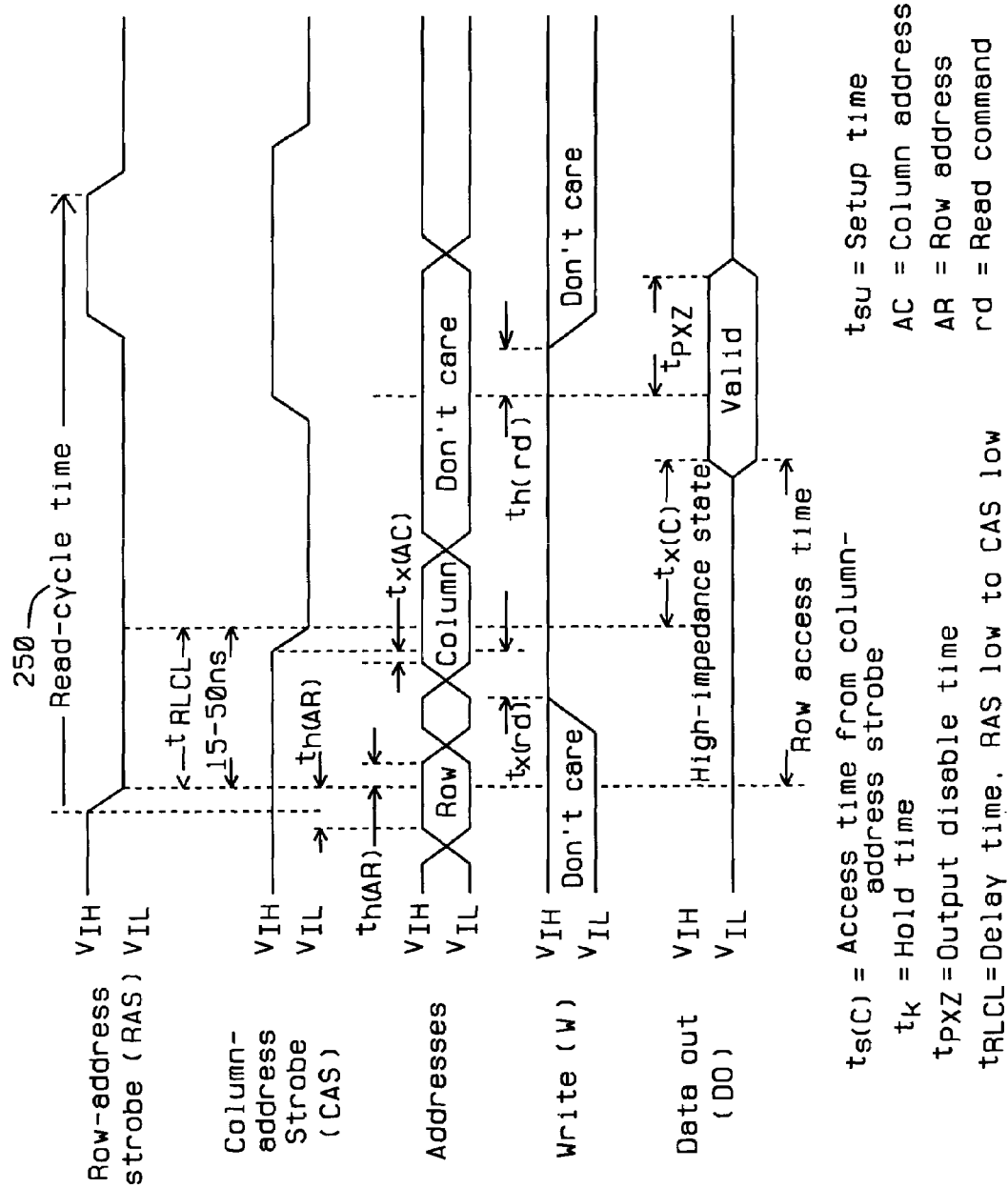
FIG. 2b is a timing diagram of an asynchronous DRAM read cycle.

FIG. 2a shows an overall block diagram of an asynchronous Dynamic random access memory DRAM. Eight address lines 240 are shown. These 8 address lines are de-multiplexed into a Row-address and column address. The row address buffer feeds a two row decoders are for each half of the memory array. The column address buffer feeds 2 column decoders, one for each half of the memory array 210, 220. The sense-refresh amplifiers 230 are used to read the 2 memory arrays 210, 220. The sense amplifiers feed the buffer and 1 of 4-output selector, which feeds the data out register. In FIG. 2a, a data-in register is shown. Also, there is a timing & control logic section, which takes in a Row access select (RAS) signal, a column access select (CAS) signal and a read-write signal (W). In FIG. 2b, the RAS signal shows a read cycle time 250. The CAS signal shows the tRLCL time, which defines the beginning of the column address strobe time from the falling edge of the Row address strobe signal. The address signal shows the row and column address. The write signal is shown as well as the Data out valid time. Regardless of any other activity, every data cell must be refreshed at least once every few ms. Accessing every row at least this often to avoid loss of stored data does this. FIG. 2a illustrates how row and column addresses are multiplexed through one set of pins 240. The timing of the row and column address refresh is shown in the read cycle timing diagram 250 of FIG. 2b. During each row access, the sense amplifiers perform their function of regenerating stored signal levels. While FIG. 2b illustrates the timing diagram of an asynchronous DRAM memory organization, specifically the row and column address functions, the scope of the invention covers synchronous DRAM memories as well.

FIG. 2a shows the following components. An are address lines. Data (D) are data lines. RAS is a row address select control line. CAS is a column address select control line. Read/Write (W) is a read/write control line. I/O are a bidirectional data bus.

FIG. 2b shows the following components. VIH is a high level of voltage for a control or data signal. VIL is a low level of voltage for a control or data signal. RAS is a row address select control line. CAS is a column address select control line. Access time from CAS is the time it takes to read data from memory measured from CAS. Hold time is the time the input data must be held valid when writing to memory. Output disable time is when the output is becoming disabled. Delay time, RAS low to CAS low is the delay required between the presentation of the row address and the column address. Setup time is the amount of time it takes to setup addresses to the input of the memory. Column address are the address bits needed to select the correct memory column. Row address are the address bits needed to select the correct memory row. Read command is the command issued to the memory controller in order to start a memory read.

Figure 3:
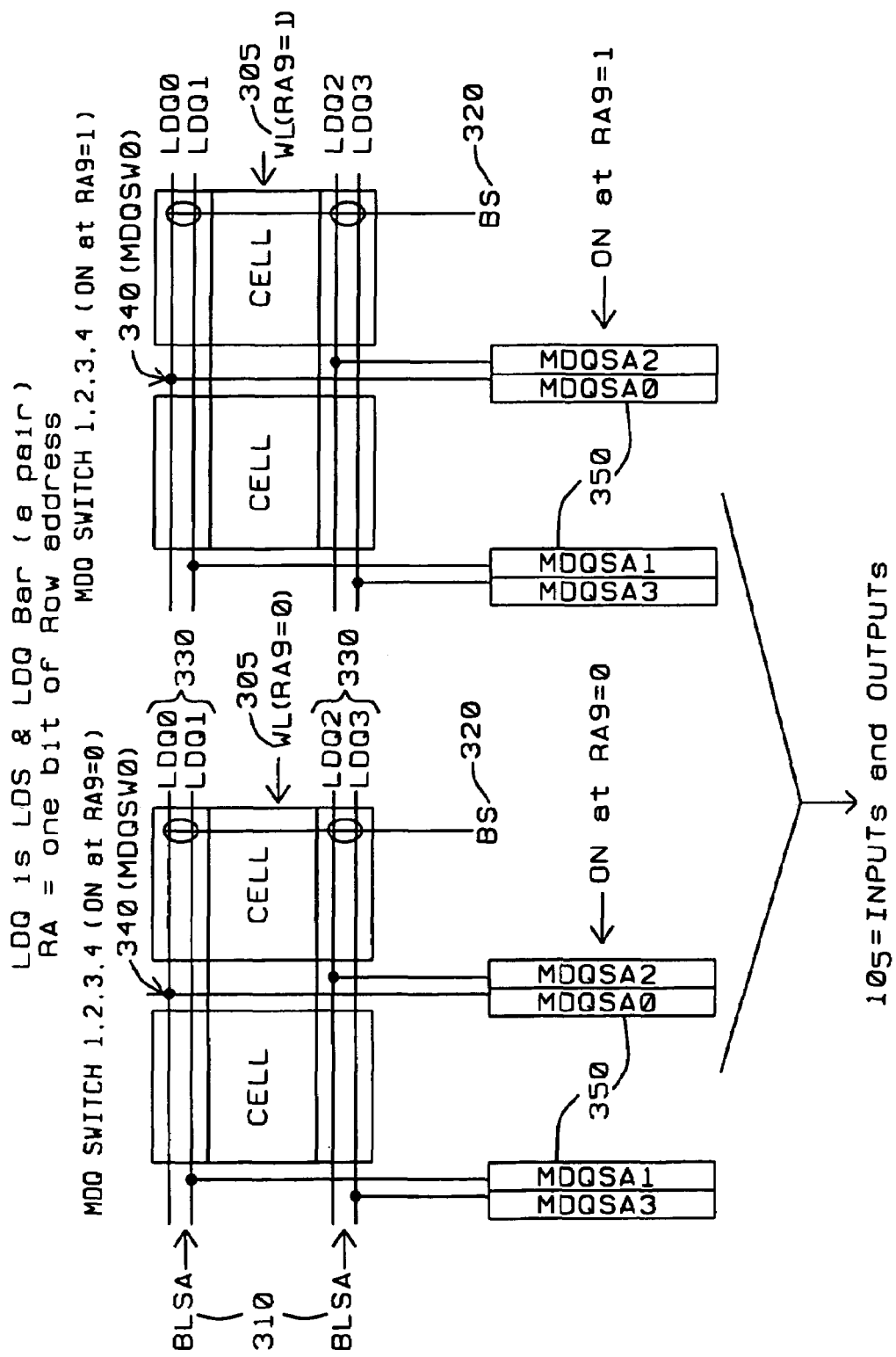
FIG. 3 is a schematic of the data path architecture of the prior art.

FIG. 3 is a schematic of the data path architecture of the prior art. A read cycle proceeds as follows. Row selection is achieved using the word line (WL) 305 row address (RA=0, 1,2 ... ). Local data lines (LDQ and LDQ bar) are stored in bit line pairs along a given word line. The selection of a word line of a DRAM cell causes data to be transferred to its bit line, with a capacitive attenuation of voltage level. There are local bit line sense amplifiers (BLSA) 310 for each of the bit lines, used to capture the relatively small change in voltage and restore it to a 1 or 0 voltage level. Bit switches (BS) 320 are used to select bit line data, in pairs, and transfer it to local line data 330. The main data line switch (MDQSW) 340 selects the signal data from the local data line and amplifies it again with the main data sense amplifier (MDQSA) 350, for each main data input and output. The high address bit of the word line row address (RA) is used to select a particular area of memory. For example, addresses RA0 to RA 8 are used as an address within each sub array and the high address bit RA9 is used to decode which sub array.

FIG. 3 shows the following components. MDQSAn are sense amplifiers. RA9 is the 9$^{th}$ address bit. BS is a bit select line. LDQn are load data lines to enable the reading of selected bit lines. BLSA are bit line sense amplifier signals. MDQ Switch n are memory data switches.

Figure 4:
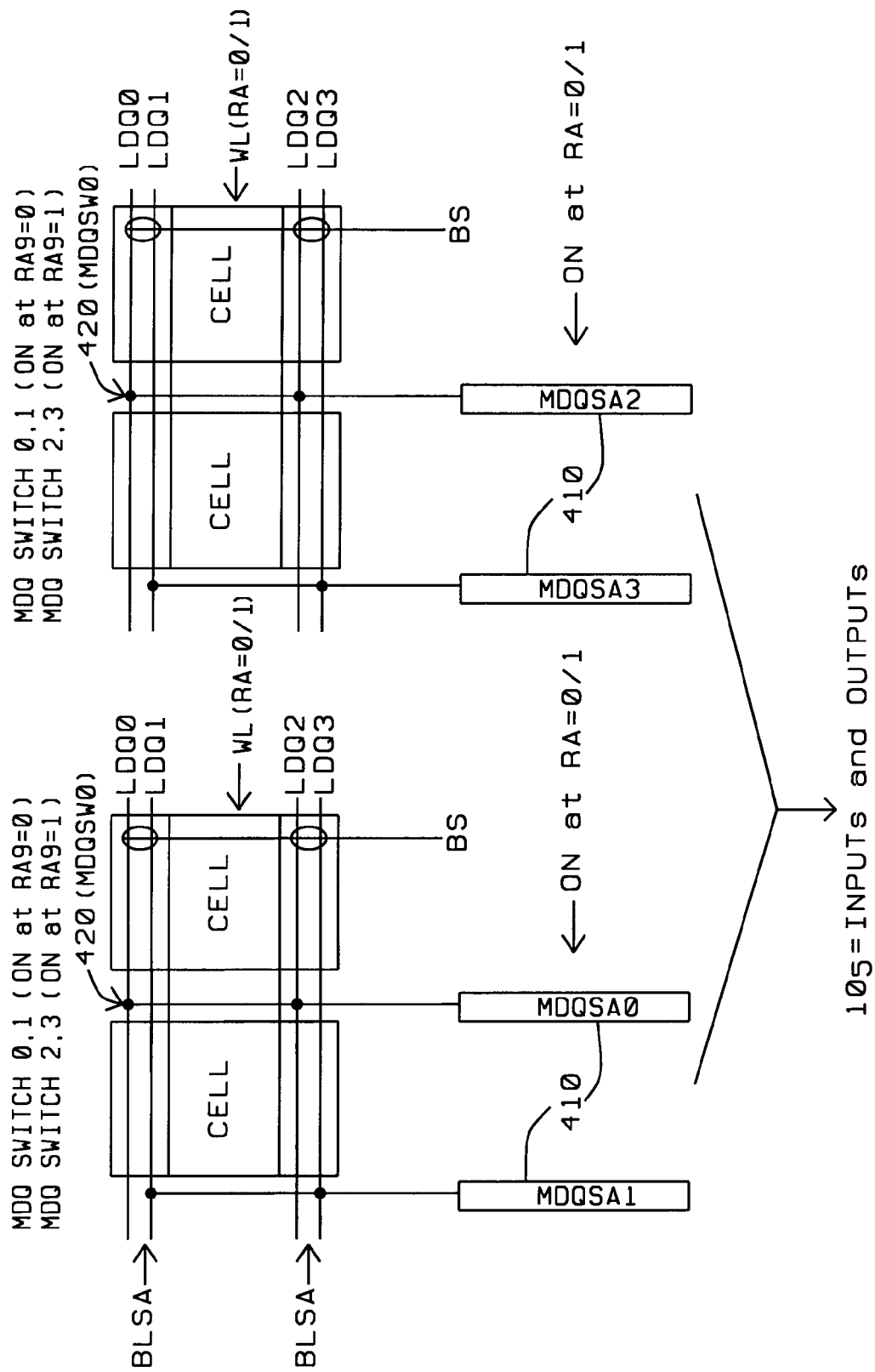
FIG. 4 is a schematic of the proposed data path architecture, with the sharing of sense amplifiers shown.

FIG. 4 shows the new data path architecture for higher area efficiency in the DRAM of the invention. A read cycle is similar, but now the high address bit of the word line row address (RA) controls the sharing of sense amplifiers (MDQSA's) 410 between adjacent cells. The main data line switch (MDQSW) 420 still selects the signal data from the local data line and amplifies it again with the main data sense amplifier (MDQSA) 410. Addresses RA0 to RA 8 are still used as an address within each sub array and now the high address bit RA9 is used to control which pair of main data lines are selected. The high address bit of the word line row address (RA) is used to select a particular main data sense amplifier (MDQSA) by means of a control switch. Not only are the sense amplifiers multiplexed for the new sub array, but the data I/O (MDQ's) are multiplexed as well. The multiplexed inputs and outputs are shown as 105 in both FIGS. 3 and 4. This leads to a significant reduction in the number of circuits required (half the sense amps and half the mdq lines), and hence the amount of chip area.

FIG. 4 shows the following components. MDQSAn are sense amplifiers. BS is a bit select line. BLSA is a bit line sense amplifier signal. LDQn are load data lines to enable the reading of selected bit lines. MDQ Switch n are memory data switches, MDQSW0 are memory switches. RA is a row address. CELL is a memory cell.

While the invention has been described in terms of the preferred embodiments, those skilled in the art will recognize that various changes in form and details may be made without departing from the spirit and scope of the invention.

What is claimed is:

1. Dynamic Random Access, DRAM, data path circuitry comprising:
   an array of memory cells,
   a bit line attached to each of said memory cells,
   a word line attached to each of said memory cells,
   a bit line sense amplifier connected to each of said bit lines,
   a bit switch which connects the output of bit line sense amplifiers to a local data line,
   a local data line switch which connects multiple local data lines to a main data line,
   a main data line sense amplifier connected to said main data lines, and
   a main data line switch connected to each of said main data line sense amplifiers, wherein a memory data input bus and data output bus are multiplexed onto a single data bus in order to save semiconductor area, wherein a high address bit of a word line row address is used to select a particular main data sense amplifier by means of a control switch.

2. The DRAM data path circuitry of claim 1 wherein said array of memory cells store 1's and 0's and are configurable as one or multiple sub-arrays.

3. The DRAM data path circuitry of claim 1 wherein said bit lines are connected to each of said memory cells for purposes of delivering Write data or retrieving Read data from said memory cells.

4. The DRAM data path circuitry of claim 1 wherein said word lines are attached to each of said memory cells in order to address and accesss said memory cells in order to Read or Write said cells.

5. The DRAM data path circuitry of claim 1 wherein said bit line sense amplifier is used to sense whether said bit line has a voltage level which indicates a logical '1' level or a logical '0' level.

6. The DRAM data path circuitry of claim 1 wherein said a bit switch which connects the output of said bit line sense amplifier to a local data line.

7. The DRAM data path circuitry of claim 1 wherein said local data line provides routing with less wires than the full complement of bit lines in order to save semiconductor area.

8. The DRAM data path circuitry of claim 1 wherein said local data line switch which connects multiple local data lines to a main data line in order to save semiconductor area.

9. The DRAM data path circuitry of claim 1 wherein said main data line provides routing with less wires than the full complement of local data lines in order to save semiconductor area.

10. The DRAM data path circuitry of claim 1 wherein said main data line sense amplifier is connected to said main data lines.

11. The DRAM data path circuitry of claim 1 wherein said main data line switch is connected to each of said main data line sense amplifiers in order to multiplex two or more main data lines into individual main data line sense amplifiers in order to save semiconductor area.

12. The DRAM data path circuitry of claim 1 wherein a row address decoder is used to convert a memory address bus into said row address word line signals.

13. The DRAM data path circuitry of claim 1 wherein a column address decoder is used to convert a memory address bus into column address signals.

14. A method of designing a DRAM data path in order to reduce the circuit density comprising the steps of:
   including an array of memory cells,
   attaching bit lines to each of said memory cells,
   attaching word lines to each of said memory cells,
   connecting bit line sense amplifiers to each of said bit lines,
   connecting bit switches from the output of bit line sense amplifiers to a local data line,
   connecting local data line switches from multiple local data lines to a main data line,
   connecting a main data line sense amplifier to said main data lines, and
   connecting main data line switches to each of said main data line sense amplifiers, wherein a memory data input bus and data output bus are multiplexed onto a single data bus in order to save semiconductor area, wherein a high address bit of a word line row address is used to select a particular main data sense amplifier by means of a control switch.

15. The method of claim 14 wherein the designing of said array of memory cells involves the storing of 1's and 0's and the configuring as one or multiple sub-arrays.

16. The method of claim 14 wherein the designing of said bit lines involves the connecting to each of said memory cells for purposes of delivering Write data or retrieving Read data from said memory cells.

17. The method of claim 14 wherein the designing of said word lines involves attaching to each of said memory cells in order to address and accesss said memory cells in order to Read or Write said cells.

18. The method of claim 14 wherein the designing of said bit line sense amplifier involves sensing whether said bit line has a voltage level which indicates a logical '1' level or a logical '0' level.

19. The method of claim 14 wherein the designing of said bit switch involves connecting the output of said bit line sense amplifier to a local data line.

20. The method of claim 14 wherein the designing of said local data line involves routing with less wires than the full complement of bit lines in order to save semiconductor area.

21. The method of claim 14 wherein the designing of said local data line switch involves connecting multiple local data lines to a main data line in order to save semiconductor area.

22. The method of claim 14 wherein the designing of said main data line involves routing with less wires than the full complement of local data lines in order to save semiconductor area.

23. The method of claim 14 wherein the designing of said main data line sense amplifier involves connecting to said main data lines.

24. The method of claim 14 wherein the designing of said main data line switch involves connecting to each of said main data line sense amplifiers in order to multiplex two or more main data lines into individual main data line sense amplifiers in order to save semiconductor area.

25. The method of claim 14 wherein the designing of a row address decoder involves using it to convert a memory address bus into said row address word line signals.

26. The method of claim 14 wherein the designing of a column address decoder involves using it to convert a memory address bus into column address signals.

* * * * *

UNITED STATES PATENT AND TRADEMARK OFFICE
CERTIFICATE OF CORRECTION

PATENT NO. : 7,054,178 B1  Page 1 of 1
APPLICATION NO. : 10/236384
DATED : May 30, 2006
INVENTOR(S) : Chun Shiah, Ming-Hung Wang and Chun-Chi Shen It is certified that error appears in the above-identified patent and that said Letters Patent is hereby corrected as shown below:

TITLE PAGE
In the Attorneys, (74), delete "George D. Saile" and replace with - - George O. Saile - -.

Signed and Sealed this

Fifth Day of September, 2006

JON W. DUDAS
*Director of the United States Patent and Trademark Office*